(12) United States Patent
Datskos

(10) Patent No.: US 6,312,959 B1
(45) Date of Patent: Nov. 6, 2001

(54) METHOD USING PHOTO-INDUCED AND THERMAL BENDING OF MEMS SENSORS

(75) Inventor: Panagiotis G. Datskos, Knoxville, TN (US)

(73) Assignee: U.T. Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/281,256

(22) Filed: Mar. 30, 1999

(51) Int. Cl.$^7$ ................................................. G01N 25/34
(52) U.S. Cl. ............................................ 436/147; 436/164
(58) Field of Search .................................. 436/164, 151, 436/167, 147; 73/24.02, 25.01, 570, 579

(56) References Cited

U.S. PATENT DOCUMENTS

| | | |
|---|---|---|
| 5,363,697 | 11/1994 | Nakagawa . |
| 5,372,930 | 12/1994 | Colton et al. . |
| 5,411,709 | 5/1995 | Furuki et al. . |
| 5,445,008 | 8/1995 | Wachter et al. . |
| 5,464,977 * | 11/1995 | Nakagiri et al. ................ 250/234 |
| 5,479,024 * | 12/1995 | Hillner et al. ................ 250/458.1 |
| 5,719,324 | 2/1998 | Thundat et al. . |
| 5,737,086 | 4/1998 | Gerber et al. ................ 356/432 |
| 5,770,856 * | 6/1998 | Fillard et al. ................ 250/234 |
| 5,918,263 * | 6/1999 | Thundat ................ 73/35.16 |
| 5,977,544 * | 11/1999 | Datskos et al. ................ 250/338.1 |
| 6,096,559 * | 8/2000 | Thundat et al. ................ 436/147 |

FOREIGN PATENT DOCUMENTS

| | | |
|---|---|---|
| 2 169 418 A | 1/1985 | (GB) . |
| WO 97/26556 | 7/1997 | (WO) . |

OTHER PUBLICATIONS

Lang, H. P. et al., "The Nanomechanical NOSE" Technical Digest; pp. 9–13, 1999.

MEMS Sensos and WirelessTelemetry for Distributed Systems, by C.L. Britton, Jr., et al., Presented at SPIE 5th International Symposium on Smart Materials and Structures, Mar. 2, 1998, San Diego, CA (8 pages total).

Measuring Intermolecular Binding Forces With the Atomic-Force Microscope: The Magnetic Jump Method, by Jan H. Hoh et al., *Proceedings*, 52nd Annual Meeting o Microscopy Society of America, Jul. 31–Aug. 5, 1994, pp. 1054–1055.

Microcantilever Sensors, by T. Thundat, et al., *Microscale Thermophysical Engineering*, 1:185–199, 1997.

* cited by examiner

*Primary Examiner*—Jeffrey Snay
(74) *Attorney, Agent, or Firm*—J. Herbert O'Toole; Hardaway/Mann IP Group

(57) ABSTRACT

A method for measuring chemical analytes and physical forces by measuring changes in the deflection of a microelectromechanical cantilever structure while it is being irradiated by a light having an energy above the band gap of the structure.

12 Claims, 3 Drawing Sheets

METHOD USING PHOTO-INDUCED AND THERMAL BENDING OF MEMS SENSORS

This invention was made with government support under contract DE AC05-96OR22460 awarded by the U.S. Department of Energy to Lockheed Martin Energy Research Corporation and the Government has certain rights in this invention.

BACKGROUND OF THE INVENTION

1. Field of the Invention

This invention relates to an instrument and a method for the detection of chemical analytes and physical forces in trace amounts using a coated surface of a microcantilever and measurement after imposing a photo-induced stress on the device.

2. Description of the Prior Art

Microeletromechanical structures are ultra-sensitive fabricated polycrystalline or single crystal devices useful for the measurement of physical forces and chemical interactions.

Vibrating quartz sensors have been used to measure antigen-antibody reactions as described in U.S. Pat. No. 4,236,893 to Rice. The detection of specific chemicals using chemical coatings over quartz crystals to obtain a bulk acoustical wave or surface acoustical wave resonator matrix detector is disclosed by Balato, U.S. Pat. No. 4,596,697. The measurement of ambient gas concentrations with a coated quartz piezoelectric crystal was disclosed by Minten et al., U.S. Pat. No. 4,637,987.

Improved sensors for immunoassays using surface acoustic waves on piezoelectric crystals are disclosed in U.S. Pat. No. 4,735,906 to Bastiaans, U.S. Pat. No. 4,847,193 to Richards et al., U.S. Pat. No. 5,501,986 to Ward et al., U.S. Patent No. 5,595,908 to Fawcett et al., U.S. Pat. No. 5,658,732 to Ebersole et al. and U.S. Pat. No. 5,705,399 to Larue. All of the above acoustical wave detectors are limited to exposure of a single reactive surface.

MEMS devices offer the potential of faster response, alternative methods of measurement of the observed changes, and smaller size.

Binnig et al., *Phys. Rev. Lett.* 56, 930 (1986) reported the use of a microfabricated beam as a mechanical stylus, which became the basis for atomic force microscopes. Detection with a split-segment photodetector allows measurement of very small movements at the cantilever tip. In 1992, Hoh et al. [*J. Am. Chem. Soc.*, 114, 4917 (1992)] reported the resolution of hydrogen bonds at a force of $1 \times 10^{-11}$N using v-shaped cantilevers of $Si_3N_4$.

Vibrating quartz crystal detectors in the shape of a tuning fork are disclosed for the detection of antibodies and other binding pairs in U.S. Pat. No. 5,179,028 to Vali et al. A refinement of the Vali et al. patent may be found in U.S. Pat. No. 5,323,636 which employs the tuning fork concept using GaAs for the substrate.

Gimzewski et al. reported the use of a coated Si cantilever as a micro-calorimeter using reflected light to measure the degree of bending of a cantilever as the result of a chemical reaction. [*Chem. Phys. Lett.*, 217, 589 (1994)]. U.S. Pat. No. 5,411,709 to Furuki et al. discloses a method for gas detection using a vibrating microcantilever coated with a thin film of a dye which fluoresces or phosphoresces in the presence of an oxidizing or reducing gas.

Wachter et al., U.S. Pat. No. 5,445,008 describes a chemical vapor detector using a piezoelectric vibrated cantilever coated with a compound-selective surface having substantially exclusive affinity for the targeted compound. Upon attachment of the targeted compound to the surface coating, the resonance frequency of the vibrating cantilever changes in a concentration-dependant way as measured by the reflected beam from a laser diode received by a photodiode detector.

Properly coated microcantilevers can be used for sophisticated detection taking advantage of both the change in resonance frequency but also stress-induced bending of the sensor, as described and claimed in U.S. Pat. No. 5,719,324 to Thundat et al. A summary of uses for microcantilever sensors may be found in Thundat et al., *Microscale Thermophysical Enoineering* 1, 185 (1997).

The methods described above are subject to variations in coatings and require many different devices for any spectrum of detection. In addition, accurate quantitation of the result over a range of concentrations becomes more difficult because of the need to be able to measure absolute values of deflection when resonance methods are not used.

BRIEF SUMMARY OF THE INVENTION

It is an object of this invention to provide a MEMS detector for chemical species and physical forces having a high degree of accuracy and reproducability over a greater dynamic range.

It is an object of this invention to provide a tunable MEMS detector having a greater dynamic range.

It is an object of this invention to provide a less expensive MEMS detection method by simplifying the fabrication process.

It is an object of this invention to provide a MEMS chemical sensor that can be made to become highly stressed before exposure to analytes. It is well known that the more stressed a surface is the more efficiently it can adsorb analytes or interact with analytes preset. The highly stressed state of the MEMS device can be accomplished using a photo-induced (electronic) stress or just thermal stress. This can apply equally to the coating or the substrate.

It is an object of this invention to provide a MEMS chemical sensor that can be made to become more selective by introducing electronic states in the surface using for example photon irradiation. In effect this would accomplish the same task as if different coatings were used. The specificity of a chemically selective layer can be tuned or even altered by the presence of electronic states. This applies to the coating, substrate, or adsorbed analytes themselves.

These and other objectives can be achieved by using the band gap of a semiconductor from which a MEMS device is fabricated to adjust the stress-induced bending of the microcantilever in the presence of chemical analytes and physical forces acting on the device.

DETAILED DESCRIPTION OF THE INVENTION

Figure 1:
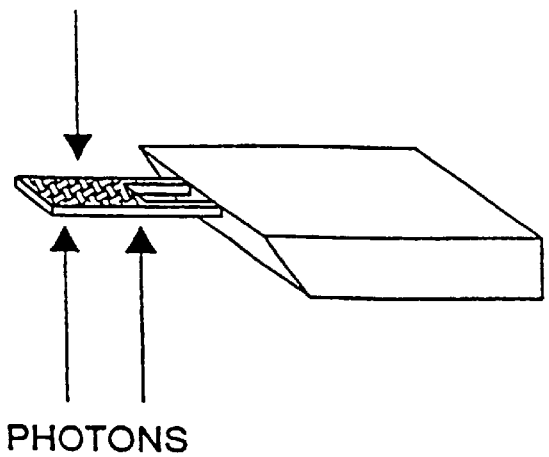
FIG. 1 is a schematic showing the mechanism used according to the present invention.

Microcantilevers formed from semiconductor materials (microelectromechanical structures or MEMS) have a number of properties which can be used to optimize detection of a broad variety of chemicals and/or physical forces acting on the MEMS. Microcantilevers can be fabricated in different shapes and sizes including microbridges, microbars or microplates. Commercially available polycrystalline devices have nominal sizes of 400 um×30 um×2 um (l,w,t). Silicon nitride cantilevers are available in nominal dimensions of 200 um×20 um×0.6 um. Special fabrication can produce cantilevers as thin as 0.3 um. The spring constant can be selected in a broad range from 0.01 to 30 N/m.

A wide variety of coatings is available. Electro-beam evaporation systems work well with many metals. Langmuir-Blodgett film transfer, plasma deposition, and sublimation are available. Sandwich coatings such as those discussed in the Background are available for both chemical and biological analytes. Because the primary interaction is adsorptive, the detection surface is reversible or easily regenerated.

Microcantilevers formed from semiconductive materials such as polycrystalline silicon, silicon nitrate, gallium arsenide, indium arsenide etc. will deflect or bend when heated by light. The coating with a material having a different coefficient or thermal expansion causes the coated cantilever to respond to heat analogously to a bimetallic element thermostat. In addition, when the light consists of or contains photons having energies greater than the band gap, a photoinduced bending occurs. The photoinduced bending may be in the same direction as the thermally induced bending or in the opposite direction, dependent upon the pressure dependence of the energy band gap.

The bending of a MEMS device in the presence of a chemical analyte and a light directed onto its surface has three components. The surface differential stress $\Delta s$ due to molecular absorption is proportional (at least to a first order approximation) to the number of adsorbed molecules and therefor to the total additional mass $\Delta m_a$, i.e., $$\delta s = C_1 m_a \qquad (1)$$

Where $C_1$ is a proportionality constant that depends on the sticking coefficient or adsorption isotherm of the adsorbed molecules. The bending $Z_{max}[=l_2/(2\ R)]$, is related to the additional mass (and differential surface stress) through $$z_{max} \approx 3C_1 \frac{(1-\upsilon)l^2}{El^2} \Delta m_a \qquad (2)$$

Therefore, measurement of the bending $Z_{max}$ allows the amount of adsorbed mass to be determined when the adsorption process is confined to only one side of the microstructure.

As molecules adsorb on the detector surface they cause a differential surface stress which will affect the mechanical properties of the material. Subsequent exposure of the surface to photons will lead to their absorption by the material the detector is made out of, the chemical coating, or even the adsorbed molecules themselves. The adsorption of photons will cause the microstructure to bend due to a number of effects including the generation of free charge carriers and rise in the temperature of the material.

In the present invention we also describe a technique that can measure reliably and very sensitively the bending of microstructure resulting from the adsorption of analytes on a microstructure surface. This is based on the fact that the photo-induced bending of microstructure depends on the amount of chemical analyte adsorbed on a surface. Microstructures will undergo bending following the adsorption of photons. The photo-induced bending is caused by the differential surface stress developed between the side exposed to photons and the unexposed side of the microstructure (see FIG. 1). For the same number of photons absorbed the photo-induced bending will differ for microstructures that have different amount of chemicals on their surfaces. This is a consequence of the fact that adsorbed molecules introduce a surface stress themselves as well as new surface energy states. Therefore, microstructures that have adsorbed molecules on their surfaces will undergo photo-induced bending that is proportional to the amount of analyte present on their surface.

Figure 2:
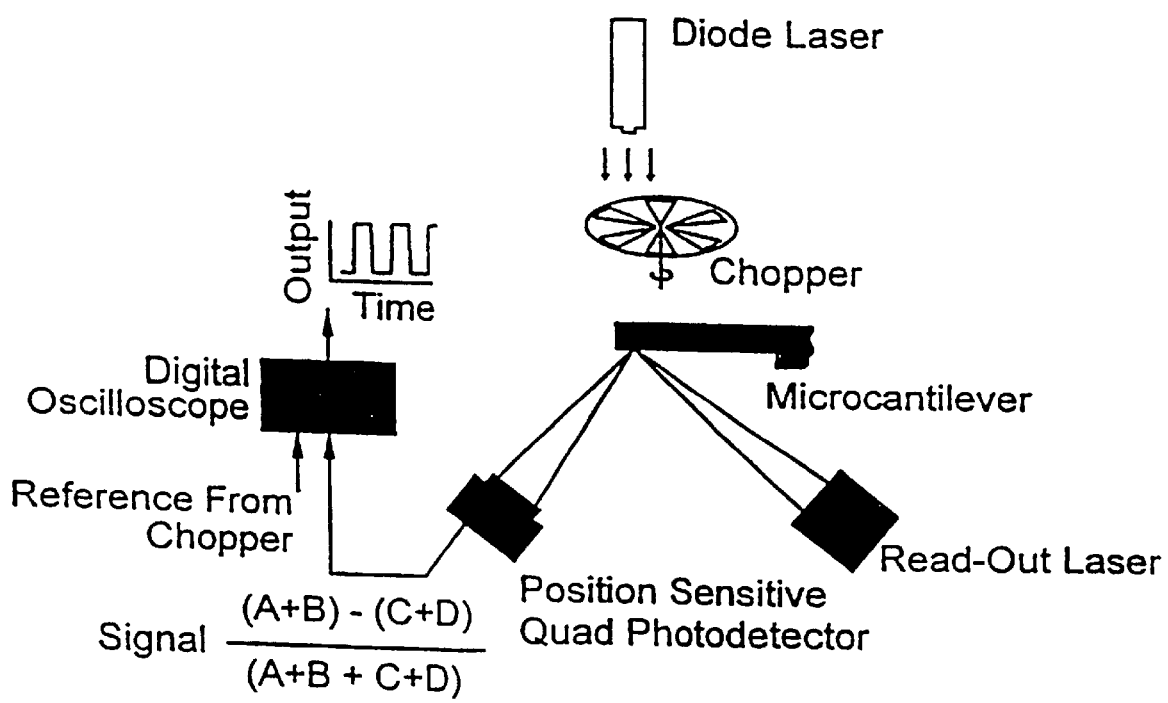
FIG. 2 is a schematic showing the arrangement of the components in a detector according to this invention.

The actual photo-induced bending of a microstructure exposed to chemical analytes can be measured with several techniques originally developed for scanning force microscopy as will be discussed later. In FIG. 2 we show schematically an embodiment that can be used to determine the adsorption of chemical analytes on microstructure surfaces using photo-induced and thermal bending. One very attractive feature of the photo-induced bending method is the fact that depending on the photon wavelength used, the direction of the bending can be changed. For example, when Si microstructures are used and irradiated with photons below the band gap (for example $\lambda$=1400 nm), Si heats up resulting in an expansion of the microstructure and it bends in one direction. However, when photons with energies above the band gap are used (for example $\lambda$=790 nm), Si contracts and the coated microstructure bends in the opposite direction. This is very important when used to increase the dynamic range. When the photo-induced bending is used as the detection method, the chemical coating does not have to be restricted to only one surface as is traditionally the case with microstructures used as chemical sensors. Coating both sides with a chemically sensitive layer will essentially increase (double) the effective area available for adsorption of analytes.

Figure 3:
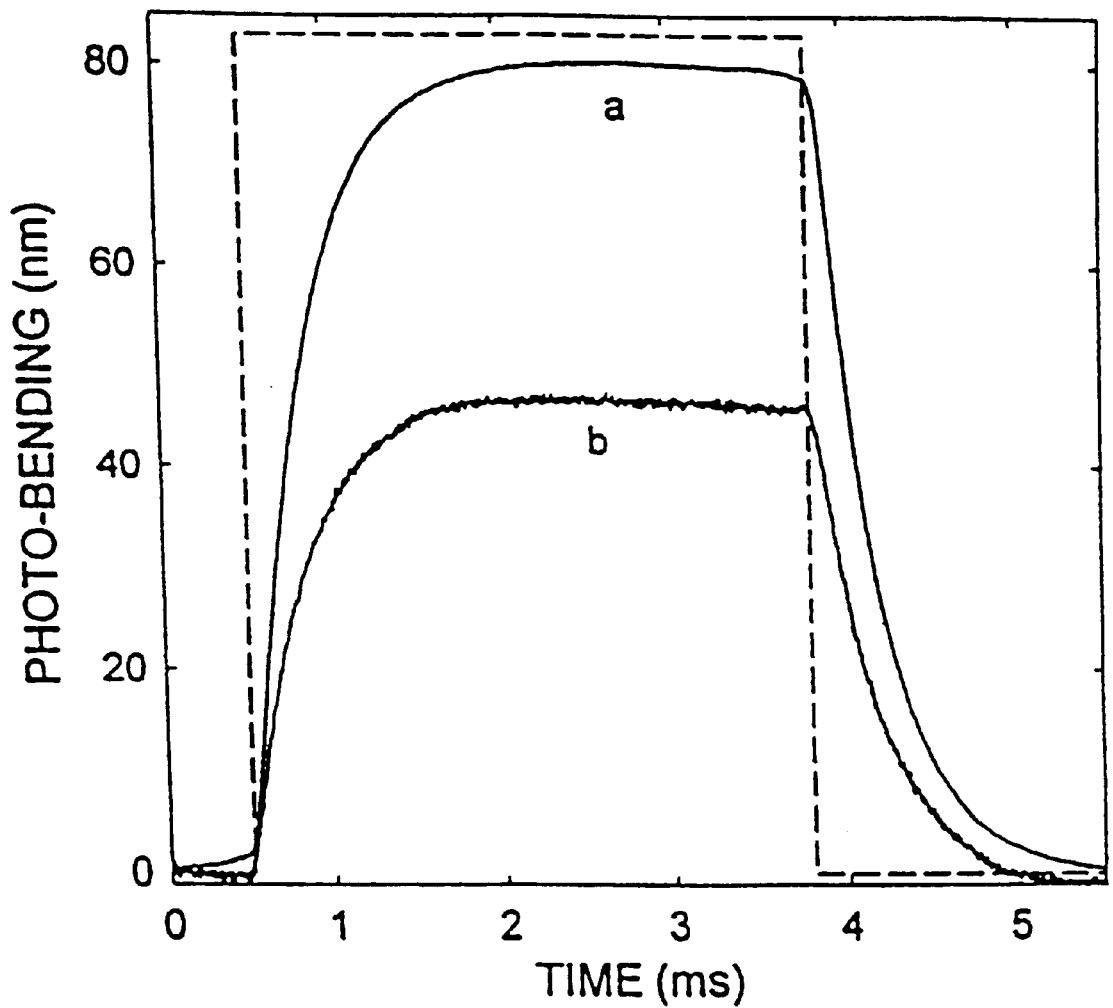
FIG. 3 is an illustration of the photo-induced bending of an Au-coated microcantilever in the absence (a) and presence (b) of diisomethyl phosphonate.

FIG. 3 shows the photo-induced bending of microstructure exposed to varying amounts of a chemical analyte diisomethyl phosphonate (DIMP). The actual bending of the sensing elements can be detected with a variety of techniques. For example, an optical read-out, a piezoelectric, or a capacitive based detection scheme may be suitable for this kind of chemical sensors which will allow the photo-induced bending of the micromechanical structure to be determined with high sensitivity. Other alternatives include measurement of diffraction or interference patterns, tunneling and magnetic changes.

FIG. 3. Photo-induced bending of a gold coated microcantilever (a) with no analytes adsorbed, (b) exposed to DIMP. The dashed curve shows the amount of time the microcantilever was exposed to photons.

The stress caused by incoming photons pays a crucial part in the present invention. The total change in strain due to changes in charge carrier concentration, $\Delta T$ is the sum of the change in the photo-induced strain, $\delta s_{pi}$, and thermal strain, $\delta s_{th}$, viz., $$\delta s = \delta s_{pi} + \delta s_{th} = \left(\frac{1}{3}\frac{d\varepsilon}{dP}\Delta n + \alpha \Delta T\right) \qquad (3)$$

where, $\epsilon_g$ is the energy band gap, P is the induced pressure and $\alpha$ is the coefficient of thermal expansion. A hole (in the valence band) decreases the energy of covalent bonds while an electron adds to the bonding or antibonding energy. Therefore, depending on the sign of $d\epsilon_g/dP$ which can be either positive or negative, there can be a competing effect between the photo-induced strain and the thermal strain.

The change in Δn in a semiconductor film with dimensions of length l, width, w and thickness t, caused by a photon flux, can be expressed as $$\Delta n = \eta \frac{\Delta \Phi \tau_L}{lwt} \quad (4)$$

Where η is the quantum efficiency, Δφ is the number of photons per unit time, and $\tau_L$, in the detector volume (=l w t).

If we make the assumption that we have a thin film on a substrate with thickness t at a constant temperature the radius of curvature will be given by $$\frac{1}{R} = \frac{6(1-\nu)}{t}\left(\frac{1}{3}\frac{d\varepsilon}{dP}\Delta n\right) \quad (5)$$

where, ν is the Poisson's ratio. Hence by measuring the radius of curvature of such a film exposed to photons (e.g., by an optical, piezoelectric or a capacitive technique) the film strain can be measured. The reciprocal of the radius of curvature is approximately equal to $d^2z/dy^2$. Then the maximum displacement $Z_{max}$ for a microstructure is given by $$z_{max} \approx \frac{(l-\nu)l^2}{t}\frac{1}{3}\frac{d\varepsilon}{dP}\Delta n \quad (6)$$

The bending is due to photo-induced surface stress in the semiconductor microstructure. Of course, the overall change in $Z_{max}$ will depend on several physical and mechanical properties of the semiconductor.

When the material or coating is not a semiconductor then the second term in equation (3) i.e. the thermal part will be important. In this way temperature changes will take place that will also result in additional stresses. These additional surface stresses will depend not only on the type of adsorbate and the material the sensor is made from but also will depend on the total amount of analyte present.

The control of stress in both degree and direction allows the tuning of the MEMS. For example, when the pressure dependence of the band gap is negative, as it is with Si, the cantilever can be moved away from a light sources emitting energetic photons below the band gap energy but toward the light sources by shifting the wavelength of the light. In this way, it is possible to set the cantilever at a null point prior to admitting an analyte and to adjust back to the null point by adjustment of the photodiode power. The reverse is the case for Ge, which has a positive pressure dependence. The excited MEMS bends differently than one which is not excited. When a static system is disturbed or revisited, it is difficult to distinguish whether bending is due to the presence of an analyte or due to noise in the form of temperature changes etc. By locking onto a photon exposure frequency, the noise (a DC phenomenon) can be eliminated and the inherently AC change can be measured.

The MEMS devices when used according to the teachings of this specification may be used to exhibit and detect a variety of physical phenomena. For example, the properties of the coating on the MEMS may be changed by heating induced by irradiation at frequencies which are lower, energetically, than the band gap of the semiconductor material from which the MEMS is fabricated. At these energies, the semiconductor is essentially transparent and the energy is introduced into the coating. The energy causes an excitation of the coating and changes the character and degree of interaction with the adsorbable species.

When the energy of the light is increased to the level where a photo-induced bending of the semiconductor material occurs, the coating on the cantilever is stressed and its surface area changed. The resultant surface is different from the unstressed surface and different from the heated surface because intraatomic distances have been altered. The degree of change is subject to adjustment or tuning by changes in the wavelength and power of the light source.

Finally, the character of the adsorbed molecules may be disturbed in a measurable way by thermal changes and the redistribution of electrons to new energy levels as the result of adsorption upon a surface (a catalytic effect).

Physical phenomena such as light, sound, heat and the movement of gasses will also affect the bending of a stressed MEMS cantilever. As with the chemical responses described supra, changes in the physical state of the surface coating will determine the response to forces impinging upon it and the quality and degree of the response can be tuned by adjustment of the frequency and power of the light impinging upon the MEMS device.

A particular advantage to this method is that measurements may be made over brief intervals. When the absolute deflection of an unstressed MEMS is measured, a drift is observed as the system fatigues, probably due to instability resulting from being maintained in an excited electronic state. When an AC method such as that disclosed herein is employed, the deflection is reproduceable due to the low hysteresis observed when the system is allowed to return to its ground state.

EXAMPLE

Figure 4:
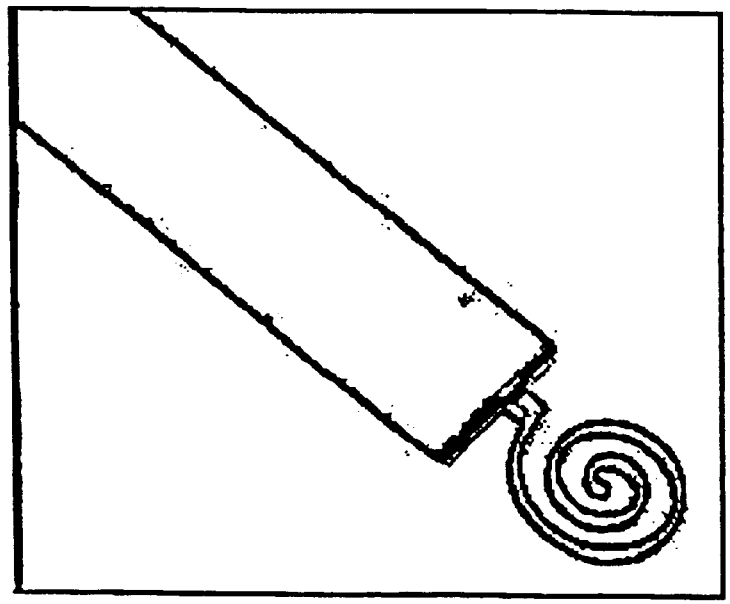
FIG. 4 is a photomicrograph of a beam type cantilever.
Figure 5:
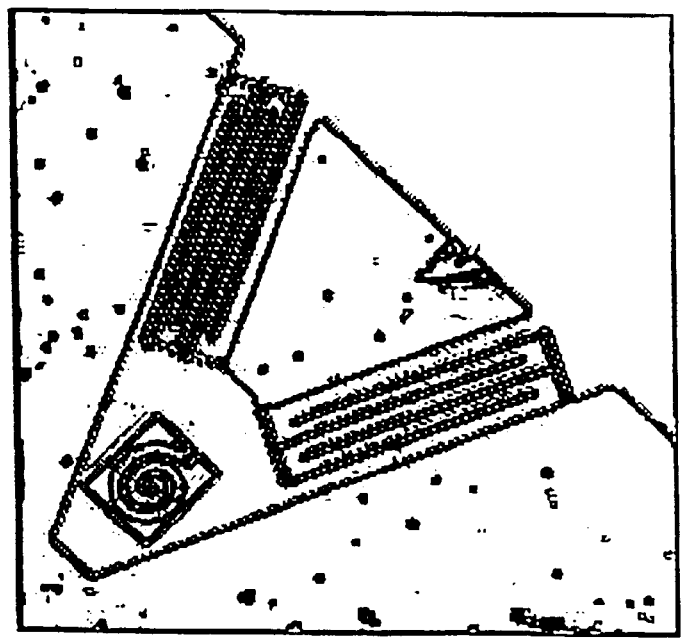
FIG. 5 is a photomicrograph of a cantilever having two anchors and a tip region etched to form a fresnel zone plate.

A commercially available microcantilever as shown in FIG. 4 was coated with a gold film on one side by sputtering and mounted on an atomic field microscope holder. The cantilever was placed in a chamber arranged as illustrated in FIG. 2. The photo-induced bending was measured when the diode laser was pulsed, as shown in FIG. 3, wherein the dashed line indicates the duration of the pulse. Curve (a) shows the movement of the cantilever tip.

DIMP was introduced into the chamber in an amount of about 500 parts per billion (ppb). The response is shown in curve (b) measured over the same pulse time.

The example and description are considered to be the preferred embodiments at the time of invention, but it will be obvious to those skilled in the art to make changes and modifications without departing from the scope of the invention disclosed herein.

I claim:

1. A method for detection of a chemical species comprising:
   a) coating a microelectromechanical cantilever device with a reactive material;
   b) mounting said cantilever device in a position whereby it may be irradiated by light having a frequency above the band gap;
   c) providing means to measure a deflection of the tip of the microcantilever;
   d) measuring the deflection of the tip while the cantilever is being irradiated;
   e) introducing the chemical species to be detected, and
   f) measuring the deflection of the tip while the cantilever is being irradiated.

2. A method according to claim 1 wherein the coating is a sputtered metal film.

3. A method according to claim 1 wherein the coating is a polymeric film.

4. A method according to claim 1 wherein the means to measure the deflection of the tip is an optical read-out laser system.

5. A method according to claim 1 wherein the means to measure the deflection of the tip is an optical diffractometer.

6. A method according to claim 1 wherein the means to measure the deflection of the tip is an optical interferometer.

7. A method according to claim 1 wherein the means to measure the deflection of the tip is selected from the group consisting of the capacitance, piezoresistivity and piezoelectricity of the micro electro mechanical device.

8. A method according to claim 1 wherein said light causes measurable changes in the electronic state of at least one of said substrate, coating and analyte.

9. A method for the quantitative measurement of a chemical species comprising;
 a) coating a microelectromechanical cantilever device with a reactive material;
 b) mounting said cantilever device in a position whereby it may be irradiated by light having a frequency above the band gap;
 c) providing means to measure a deflection of the tip of the microcantilever;
 d) measuring the deflection of the tip while the cantilever is being irradiated;
 e) introducing a known amount of the chemical species to be detected;
 f) measuring the deflection of the tip while the cantilever is being irradiated;
 g) introducing an unknown amount of a chemical species to the region of the cantilever;
 h) measuring the deflection of the tip while the cantilever is being irradiated, and
 i) determining the amount of chemical species present by interpolation.

10. A method for detection of a physical force comprising:
 a) coating a microelectromechanical cantilever device with a material having a different index of thermal expansion;
 b) mounting said cantilever device in a position whereby it can be irradiated by a light having a frequency above the band gap;
 c) providing means to measure a deflection of the tip of the cantilever device;
 d) measuring the deflection of the tip while the cantilever is being irradiated;
 e) exposing the cantilever to a physical force, and
 f) measuring the deflection of the tip while the cantilever is being irradiated by the light of part (c) and exposed to said physical force.

11. A method according to claim 9 wherein the physical force is selected from the group consisting of heat, light, sound and gravity.

12. A method according to claim 1 wherein the measurements are made by switching the light source on and off on a regular cycle.

* * * * *